United States Patent
Yen et al.

(10) Patent No.: US 12,269,135 B2
(45) Date of Patent: Apr. 8, 2025

(54) WORK PIECE HOLDER AND METHOD OF TRANSFERRING A WORK PIECE

(71) Applicant: Taiwan Semiconductor Manufacturing Company, Ltd., Hsinchu (TW)

(72) Inventors: Hsu Tung Yen, Hsinchu (TW); Ling-Sung Wang, Hsinchu (TW); Chen-Chieh Chiang, Kaohsiung (TW); Kun-Ei Chen, Hsinchu (TW); Bo Hsiang Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 48 days.

(21) Appl. No.: 18/307,016

(22) Filed: Apr. 26, 2023

(65) Prior Publication Data
US 2024/0359279 A1 Oct. 31, 2024

(51) Int. Cl.
*B23Q 1/26* (2006.01)
(52) U.S. Cl.
CPC .................................... *B23Q 1/26* (2013.01)
(58) Field of Classification Search
CPC ........ B23Q 1/26; F16M 13/00; H01L 21/673; H01L 21/6734; H01L 21/67309; H01L 21/67373; H01L 21/67383; H01J 9/46; B65G 49/062; Y10S 206/832

USPC ........................................................ 211/41.1
See application file for complete search history.

(56) References Cited

U.S. PATENT DOCUMENTS

| | | | | |
|---|---|---|---|---|
| 4,358,018 A * | 11/1982 | Wolfe | ..................... | B60R 7/088 211/163 |
| 4,647,117 A * | 3/1987 | Ackeret | ................. | G11B 23/02 |
| 4,772,077 A * | 9/1988 | Beam | ................ | G11B 33/0444 211/41.12 |
| 5,061,144 A * | 10/1991 | Akimoto | ........... | H01L 21/68707 414/935 |
| 5,577,621 A * | 11/1996 | Yi | ..................... | H01L 21/67309 211/41.18 |
| 5,615,988 A * | 4/1997 | Wiesler | ............. | H01L 21/68707 414/811 |
| 5,788,088 A * | 8/1998 | Kao | .................... | G11B 33/0405 |
| 6,145,673 A * | 11/2000 | Burrows | ............. | H01L 21/6732 211/41.18 |
| D436,490 S * | 1/2001 | Kwok | ........................ | D6/682.2 |
| 6,558,562 B2 * | 5/2003 | Mallery | ................. | G11B 23/00 438/692 |
| D488,019 S * | 4/2004 | Hassett | .......................... | D6/630 |
| 7,845,891 B2 * | 12/2010 | Lee | .................... | H01L 21/67201 414/217 |
| 8,528,762 B2 * | 9/2013 | Kurita | ................ | B23K 15/0006 220/4.01 |

\* cited by examiner

*Primary Examiner* — Ko H Chan
(74) *Attorney, Agent, or Firm* — JCIPRNET

(57) ABSTRACT

A work piece holder provided herein includes a support baffle and an elevating element. The support baffle extends along an arc path. The elevating element is disposed on the support baffle and is pivoted to be movable between an unlock status and a lock status.

20 Claims, 10 Drawing Sheets

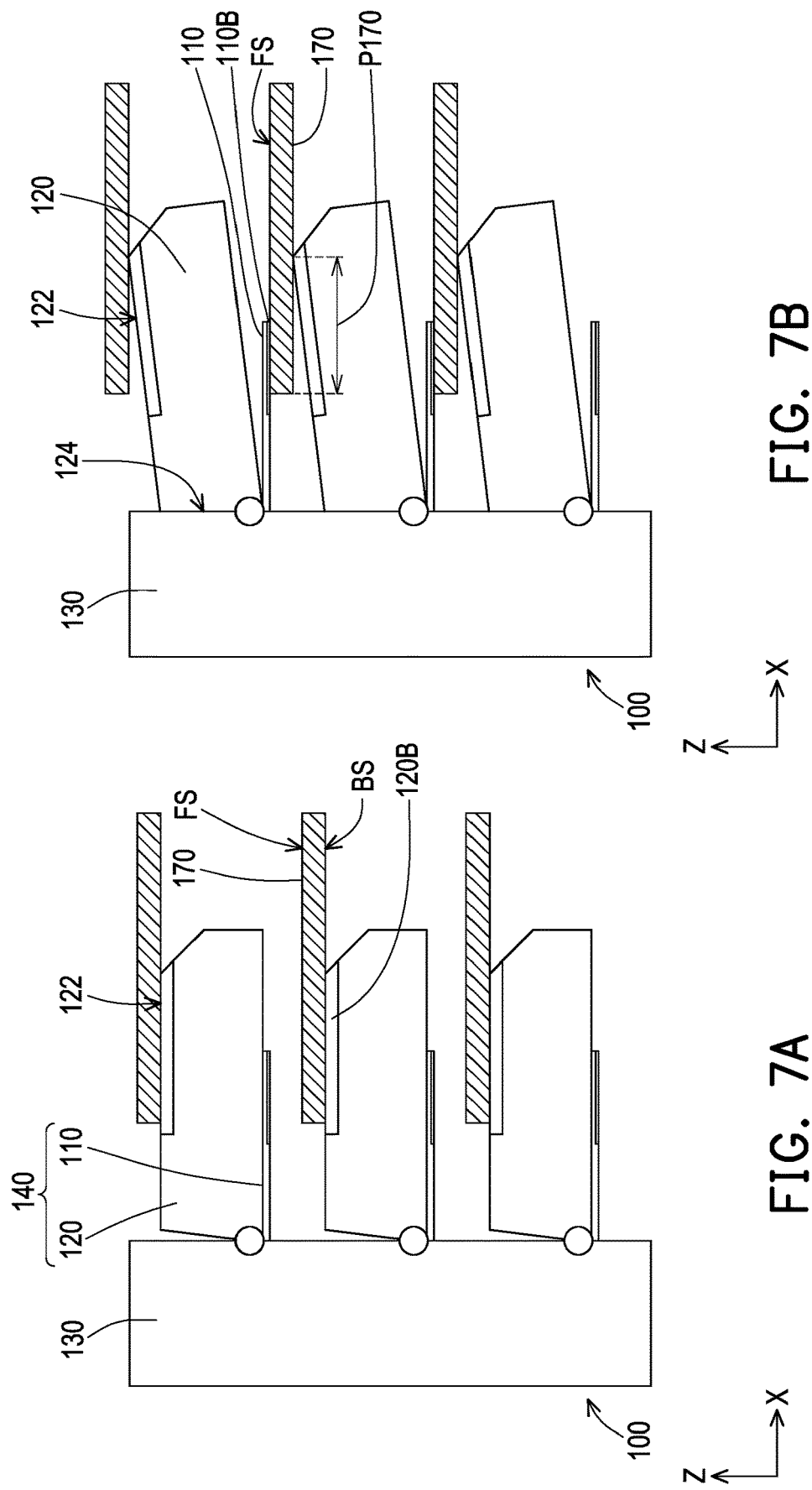

WORK PIECE HOLDER AND METHOD OF TRANSFERRING A WORK PIECE

BACKGROUND

Processing of semiconductor wafers requires multiple processing tools and the semiconductor wafers are transferred between the processing tools. The defect caused during the transferring is inescapable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A to 7E schematically illustrate a method of transferring a work piece in accordance with some embodiments.

DETAILED DESCRIPTION

Figure 1:
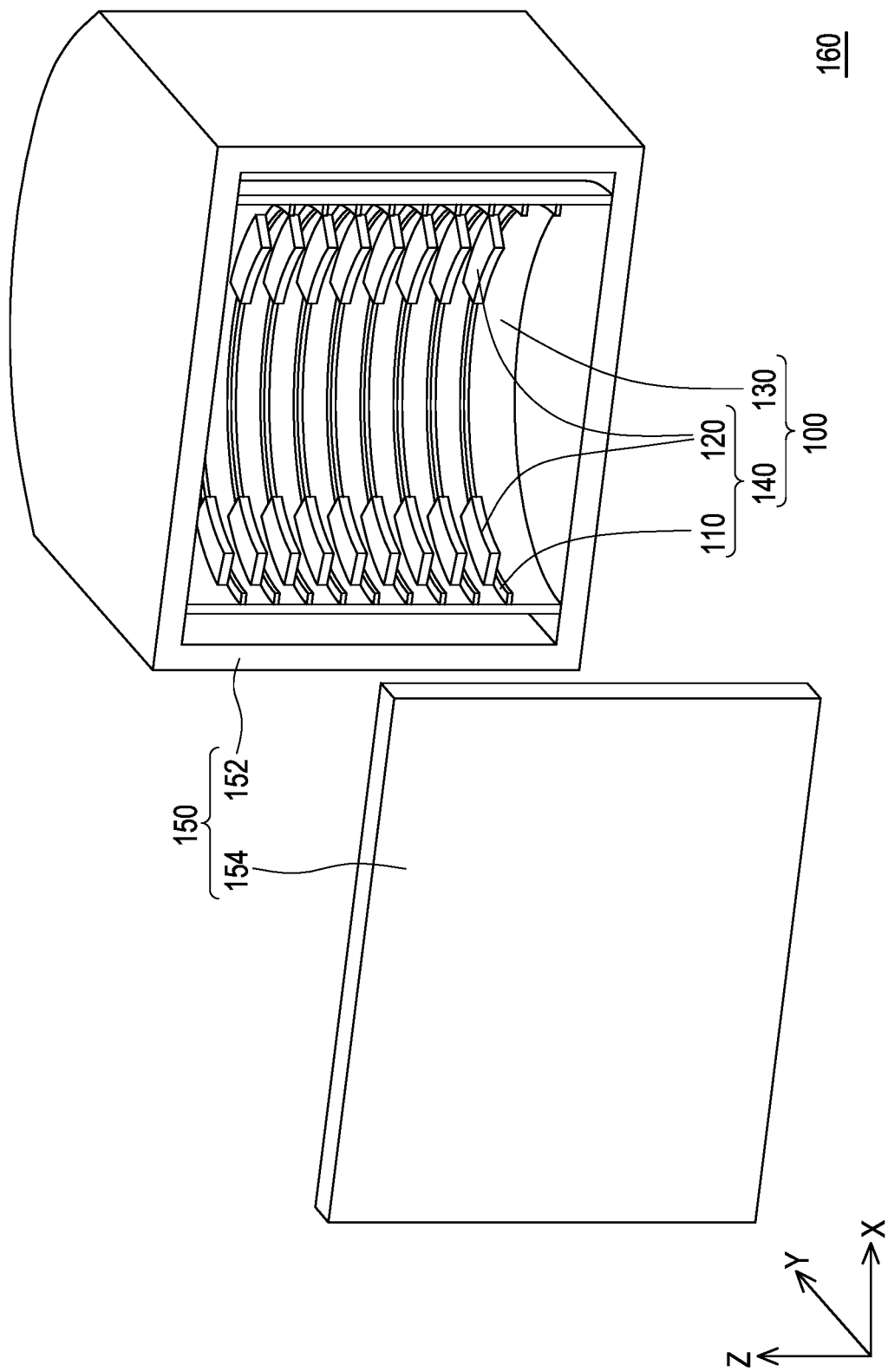
FIG. 1 schematically illustrates a work piece container in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a work piece container in accordance with some embodiments of the disclosure. Referring to FIG. 1, a work piece holder 100 at least includes a support baffle 110 and an elevating element 120. The support baffle 110 extends, for example, along an arc path on the X-axis and Y-axis plane for holding a circular work piece, but the disclosure is not limited thereto. In some embodiments, the extending path of the support baffle 110 may be arranged in other shapes. The elevating element 120 is disposed along the support baffle 110 and pivoted to be movable. For example, the elevating element 120 is able to move between an unlock status and a lock status under the operation of the pivoted connection.

In some embodiments, the work piece holder 100 includes a plurality of shelves 140 and each shelf 140 includes a pair of elevating elements 120 connected to one of the support baffles 110. The work piece holder 100 further includes a support wall 130 standing in Z-axis and extending along an arc path on X-axis and Y-axis plane. As shown in FIG. 1, multiple shelves 140 are connected to the inner side of the support wall 130 and the shelves 140 are arranged in Z-axis in parallel. In each shelf 140, the pair of elevating elements 120 is arranged symmetrically. In some embodiments, each support baffle 110 is connected to and/or fixed to the support wall 130 at the inner side of the support wall 130 and protruded towards the center of the arc path of the support wall 130. Each of the elevating elements 120 is pivoted at a connection between the support baffle 110 and the support wall 130. In some alternative embodiments, the elevating element 120 may be pivoted at an end of the elevating element 120 adjacent to the support wall 130 so that an end of the elevating element 120 away from the support wall 130 is a free end and configure to rotate about the pivot axis at the end of the elevating element 120 adjacent to the support wall 130.

In some embodiments, the work piece holder 100 is accommodated inside a housing 150 to form a work piece container 160. In other words, the work piece container 160 may include the work piece holder 100 and the housing 150. The housing 150 includes, for example, a chamber 152 and a front door 154. The front door 154 is detachably attached to the chamber 152 to allow the operation of placing a work piece onto the work piece holder 100 and retrieving a work piece from the work piece holder 100. The work piece container 160 may be a front opening unified pod (FOUP), a front opening shipping box (FOSB), a wafer standardized mechanical interface (SMIF) pod, a sorter, or a combination thereof.

In some embodiments, each of the work pieces to be holed by the work piece holder 100 includes a flat, circular and thin piece. In an application of the semiconductor manufacture, the work piece to be hold by the work piece holder 100 includes a semiconductor wafer. Each of the shelves 140 arranged on the support wall 130 may support one piece of semiconductor wafer so that the work piece holder 100 holds and supports multiple semiconductor wafers. The work piece container 160, for example, is configured to transfer multiple semiconductor wafers through interbay and/or intrabay transferring, but the disclosure is not limited thereto. In some embodiments, the door 154 is configured to seal the chamber 152 and the housing 150 is vacuumed after work pieces are placed on the work piece holder 100 inside the housing 150 so as to keep the work pieces from external contamination.

In some embodiments, the front surface of the work piece includes components that facilitate the required circuitry and/or functions. In some embodiments, the work piece is placed on and leans against the elevating element 120 with the front surface of the work piece facing up, e.g. facing away from the elevating element 120, so that the elevating element 120 would least likely damage the components formed on the front surface of the work piece. In addition, in some embodiments, the elevating element 120 is pivoted to elevate the work piece so that the work piece is, for example, clipped by the elevating element 120 of one shelf 140 and the support baffle 110 of a next shelf. Since the work piece is clipped by the elevating element 120 of one shelf 140 and the support baffle 110 of a next shelf, the work piece holder 100 is allowed to be flipped, for example, oriented upside down, without striking the work piece. In other words, the work piece holder 100 allows to support the work piece in different orientations.

Figure 2:
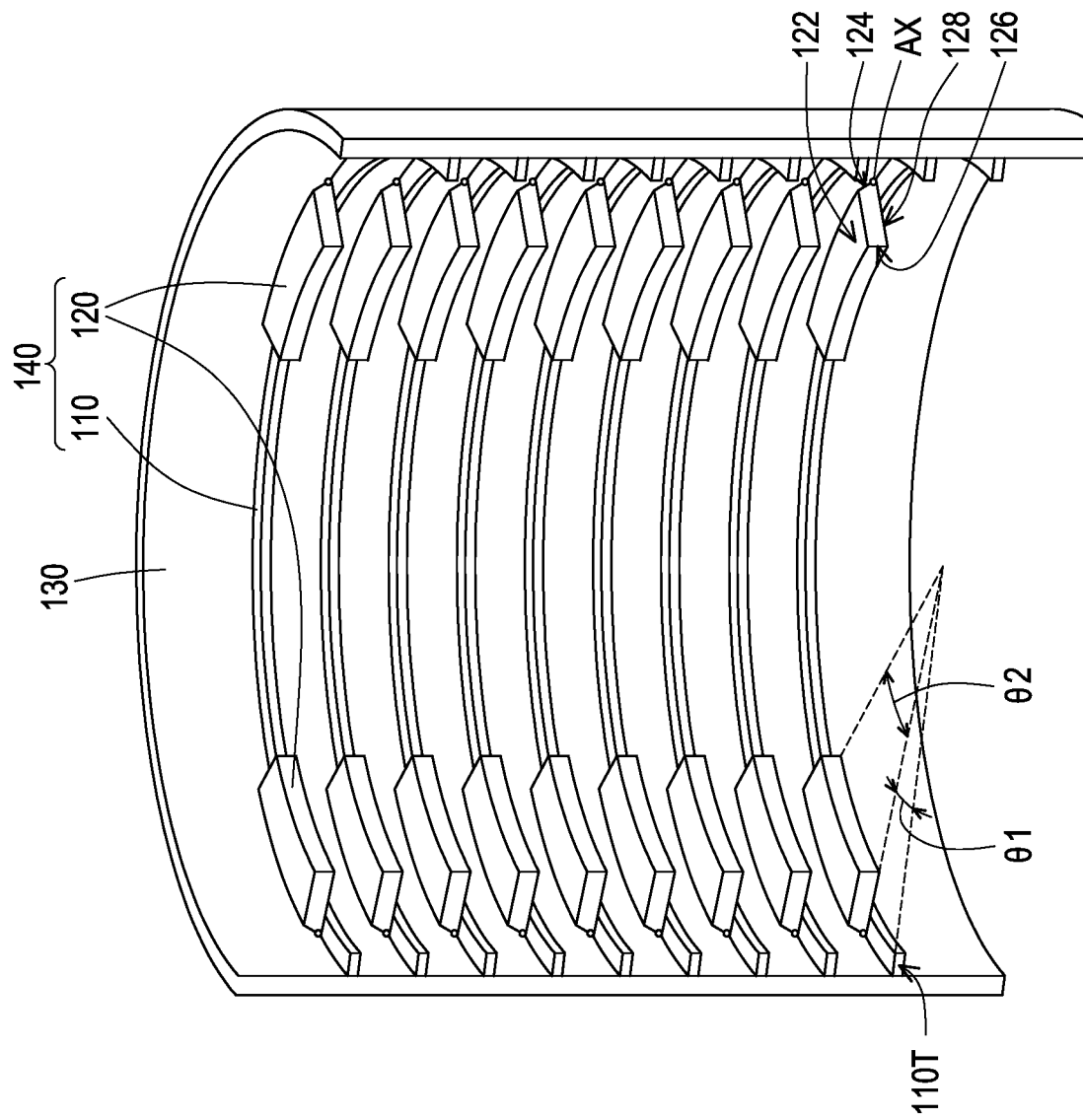
FIG. 2 schematically illustrates a work piece holder in accordance with some embodiments of the disclosure.

FIG. 2 schematically illustrates a work piece holder in accordance with some embodiments of the disclosure. The work piece holder 100, which is similar to that depicted in FIG. 1, includes a support wall 130 and shelves 140. The support wall 130 stands in Z-axis and extends along an arc path on X-axis and Y-axis plane. In some embodiments, the arc path may be arranged at a diameter greater than the diameter of the work piece to be hold. Each of the shelves 140 extends on the X-axis and Y-axis plane along the arc path of the support wall 130 and the shelves 140 are arranged in Z-axis in parallel so that the shelves 140 would maintain multiple work pieces in a horizontal (e.g. X-axis and Y-axis plane) configuration.

Each of the shelves 140 includes a support baffle 110 and a pair of elevating elements 120. The support baffle 110 extends along the arc path of the support wall 130 and the pair of elevating elements 120 is arranged symmetrically on the support baffle 110. The support baffle 110 may be fixed to the support wall 130 and thus the support baffle 110 may not move relatively to the support wall 130. In some embodiments, the support wall 130 and the support baffle 110 are made of, for example, plastic, barrier material, Carbon-filled PC or a combination thereof.

Each of the elevating element 120 includes a contacting surface 122 opposite to the support baffle 110. The contacting surface 122 is configured to contact with the work piece to be hold and includes buffer material that is relatively soft and/or elastic than other portions of the elevating element 120. In some embodiments, the buffer material of the contacting surface 122 includes, for example, rubber or the like and other portion of the elevating element 120 may be made of a material the same as the support baffle 110, such as plastic, barrier material, Carbon-filled PC or a combination thereof. The contacting surface 122 may extend on X-axis and Y-axis plane to support the work piece in a horizontal configuration.

Each of the elevating element 120 includes a stop surface 124 located at a near end of the elevating element 120 adjacent to the support wall 130 and the stop surface 124 faces the support wall 130. The stop surface 124 is oblique with respect to the contacting surface 122. Each of the elevating element 120 includes a distal surface 126 at the distal end of the elevating element 120 away from the support wall 130. The stop surface 124 and the distal surface 126 are opposite surfaces and the contacting surface 122 extends between the stop surface 124 and the distal surface 126. In addition, each of the elevating element 120 includes a leaning surface 128 configured to lean against the support baffle 110 and opposite to the contacting surface 122. The leaning surface 128 extends between the stop surface 124 and the distal surface 128. Each of the elevating element 120 is pivoted at an intersection of the stop surface 124 and the leaning surface 128. In other words, a pivot axis AX of the elevating element 120 is arranged at an intersection of the stop surface 124 and the leaning surface 128.

The elevating element 120 moves between an unlock status and a lock status through rotating about the pivot axis AX. At the unlock status, the leaning surface 128 leans against the support baffle 110 as shown in FIG. 2. At the lock status, the elevating element 120 rotates about the pivot axis AX to be included with the support baffle 110 by an included angle and the stop surface 124 leans against the support wall 130. In some embodiments, the elevating element 120 may have a substantially rectangular shape in X-axis and Y-axis plane so that the pivot axis AX is a straight axis which allows the elevating element 120 rotating about the pivot axis AX at a fixed radius. Through the rotating, the distal end of the elevating element 120 is located at different levels under the unlock status and the lock status so that the work piece supported by the work piece holder 100 is elevated in Z-axis by the movement of the elevating element 120.

In some embodiments, the elevating element 120 is spaced from a terminal 110T of the support baffle 110 by a first radian θ1 along the arc path of the support baffle 110 on the X-axis and Y-axis plane. In some embodiments, the first radian θ1 is more than 10 degrees. Accordingly, the elevating element 120 is arranged relative shrunk from the terminal 110T of the support baffle 110. In some embodiments, the elevating element 120 extends in a range of a second radian θ2 along the arc path of the support baffle 110 on the X-axis and Y-axis plane and the second radian θ2 is from 10 degrees to 70 degrees. In some embodiments, a sum of the first radian θ1 and the second radian θ2 is smaller than 80 degrees. Accordingly, the overall extending range of the shelf 140 along the arc path is less than 180 degrees, less than 160 degrees, or less than 150 degrees. In the application of semiconductor manufacture, the work piece holder 100 is configured to hold semiconductor wafers. In some embodiments, the semiconductor substrate of the semiconductor wafer may be oriented that the pair of the elevating elements 120 is arranged in a range of radian not perpendicular to the lattice direction (100) of the semiconductor substrate.

Figure 3:
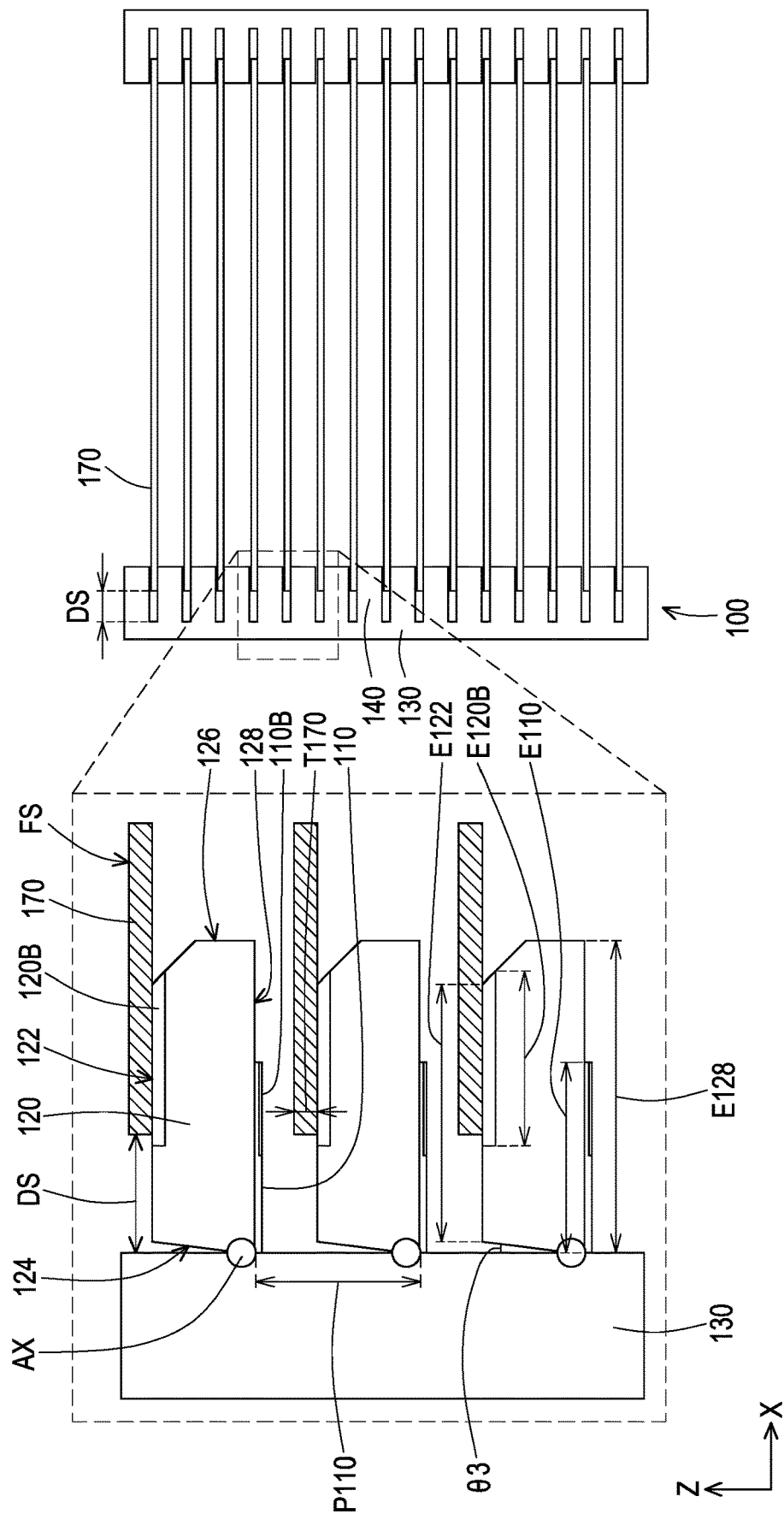
FIG. 3 schematically illustrates a work piece holder holding multiple work pieces in accordance with some embodiments.

FIG. 3 schematically illustrates a work piece holder holding multiple work pieces in accordance with some embodiments. In FIG. 3, a work piece holder 100 is provided and multiple work pieces 170 are placed and/or loaded on the work piece holder 100. The work piece holder 100 is similar to those depicted in the previous embodiments and thus similar references numbers in the drawings refer to similar elements. Specifically, the work piece holder 100 includes a support wall 130 and multiple shelves 140 connected to the support wall 130 and FIG. 3 schematically presents the cross sectional view of the structure. Each of the shelves 140 includes a support baffle 110 and an elevating element 120. In some embodiments, the elevating element 120 is pivoted to move between an unlock status and a lock status and the work piece holder 100 in FIG. 3 holds and/or supports the work pieces 170 with the elevating element 120 at the unlock status.

As shown in FIG. 3, each elevating element 120 has a contacting surface 122, a stop surface 124, a distal surface 126 and a leaning surface 128. The work piece 170 is placed on and in contact with the contacting surface 122 of the elevating element 120. In addition, the elevating element 120 includes a buffer material 120B on the contacting surface 122 away from the support baffle 110 and the work piece 170 is in direct contact with the buffer material 120B. The buffer material 120B may include rubber or the like that is relative soft and elastic than other portions of the elevating element 120. In some embodiments, the extending length E120B of the buffer material 120B may extend from the distal surface 126 toward the stop surface 124 by a sufficient length so that the edge of the supported work piece 170 is located on and overlapped with the buffer material 120B. In other words, the contact area of the work piece 170 in contact with the elevating element 120 may completely overlap with the buffer material 120B on the contacting surface 122. The support baffle 110 may also include a buffer material 110B disposed on the surface of the support baffle 110 away from the elevating element 120.

As shown in FIG. 3, the elevating element 120 is pivoted at the pivot axis AX. The pivot axis AX is disposed between the stop surface 124 and the leaning surface 128 and is located at the near end of the elevating element 120 adjacent to the support wall 130. The stop surface 124 is oblique relative to the contacting surface 122, and the contacting surface 122 is substantially parallel to the leaning surface 128. At the unlock status as shown in FIG. 3, the leaning surface 128 leans against the support baffle 110 and the stop surface 124 is included with the support wall 130 by an included angle θ3 without in contact with the support wall 130.

In some embodiments, the extending length E110 of the support baffle 110 outwardly from the support wall 130 may be ranged from 5 mm (millimeter) to 6 mm. For example, the extending length E110 of the support baffle 110 is 5.6 mm. The extending length E128 of the leaning surface 128 of the elevating element 120 is greater than the extending length E110 of the support baffle 110. For example, the extending length E128 of the leaning surface 128 of the elevating element 120 is about 9 mm to 10 mm, for example 9.1 mm. The extending length E122 of the contacting surface E122 of the elevating element 120 is less than the extending length E128 of the leaning surface 128 of the elevating element 120. For example, the extending length E122 of the contacting surface 122 of the elevating element 120 is 8 mm to 9 mm, for example 8.2 mm. In some embodiments, the support baffles 110 are arranged in Z-axis at a pitch P110. The pitch P110 may be about six times of the thickness T170 of the work piece 170. In an example, the thickness T170 of the work piece 170 is about 0.8 mm and the pitch P110 is about 4.7 mm so that the space between the supported work pieces 170 is sufficient for placing or picking the work piece 170 on the work piece holder 100, but the disclosure is not limited thereto. In some embodiments, the supported work piece 170 may keep a distance DS from the support wall 130 and the distance DS may be 2 mm to 3 mm, for example 2.2 mm. In some embodiments, the support wall 130 extends along an arc path of a diameter that is a sum of the diameter of the work piece 170 plus twice of the distance DS.

In some embodiments, the support baffle 110 is fixed on the support wall 130 and the elevating element 120 is rotatable about the pivot axis AX. The included angle θ3 formed between the support wall 130 and the stop surface 124 determines the rotating of the elevating element 120. For example, the elevating element 120 is rotatable about the pivot axis AX to reduce the included angle θ3 until the stop surface 124 in contact with the support wall 130. In some embodiments, the included angle θ3 ranges from 0 degree to 30 degrees, or ranges from 0 degree to 28 degrees.

Figure 4:
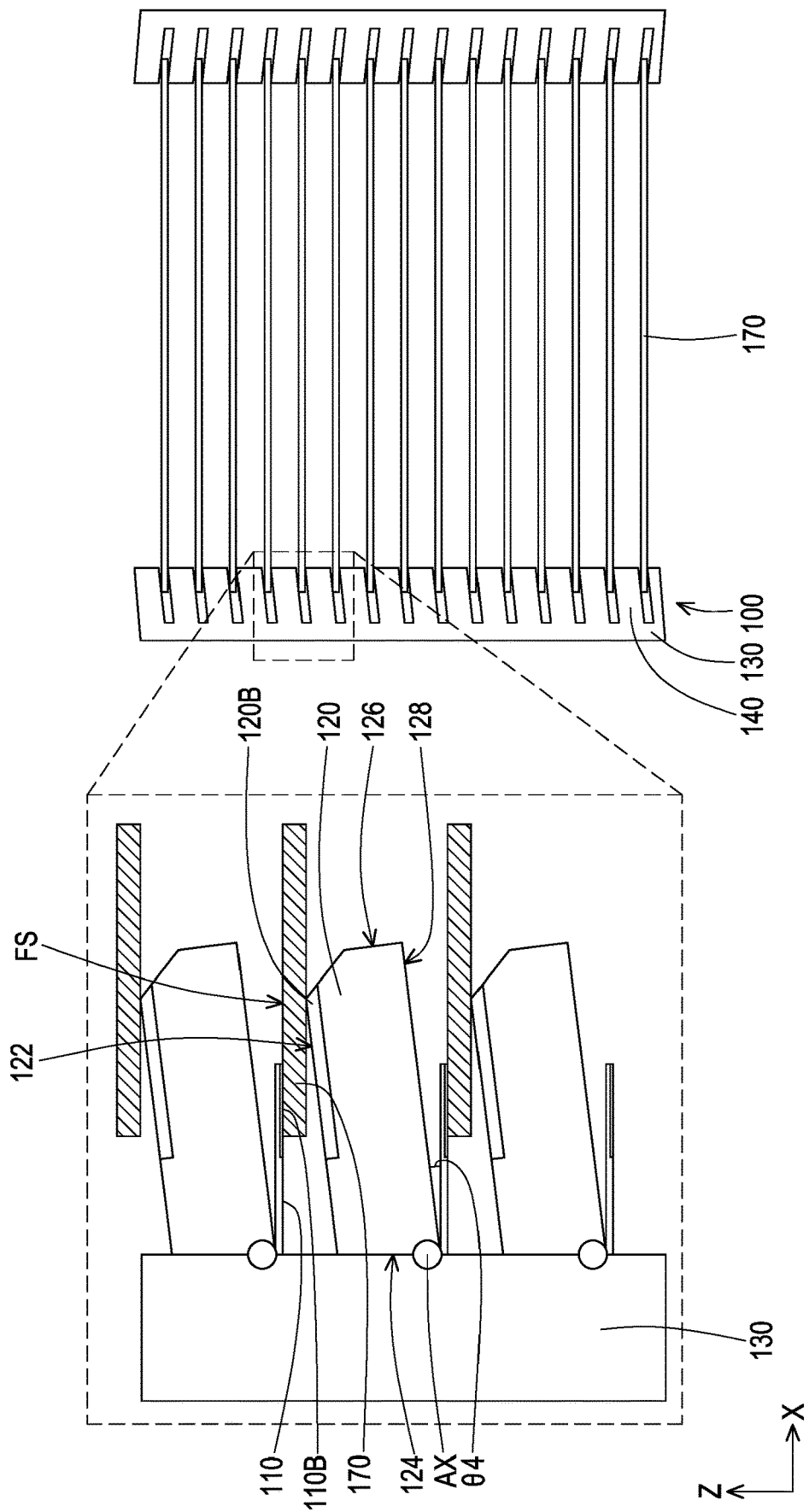
FIG. 4 schematically illustrate a work piece holder holding multiple work pieces in accordance with some embodiments.

FIG. 4 schematically illustrate a work piece holder holding multiple work pieces in accordance with some embodiments. Specifically, FIG. 4 presents the work piece holder 100 with the elevating element 120 at the lock status. As the descriptions of FIG. 3, the elevating element 120 of the work piece holder 100 is rotatable about the pivot axis AX and the rotation of the elevating element 120 stops when the stop surface 124 in contact with the support wall 130, which is described as the lock status in the disclosure. In FIG. 4, the elevating element 120 is rotated to move to the lock status. Specifically, the stop surface 124 leans against the support wall 130 and the leaning surface 128 of the elevating element 120 is spaced from the support baffle 110. In some embodiments, the leaning surface 128 is included with the support baffle 110 by an included angle θ4. The included angle θ4 is corresponding to the included angle θ3 depicted in FIG. 3 and ranges from 0 degree to about 30 degree. In some embodiments, the included angle θ4 changes with the include angle θ3. For example, in the unlock status presented in FIG. 3, the included angle θ3 is 28 degrees and the included angle θ4 is 0 degree so that the leaning surface 128 leans against the support baffle 110 and the stop surface 124 is spaced from the support wall 130. Alternately, in the lock status presented in FIG. 4, the included angle θ3 is 0 degree and the includes angle is 28 degrees so that the leaning surface 128 is spaced from the support baffle 110 and the stop surface 124 leans against the support wall 130.

In addition, in FIG. 4, the elevating element 120 elevates the work piece 170 to a level different from the level presented in FIG. 3. The elevating element 120 at the lock status may contact the work piece 170 at the tip of the contacting surface 122. The elevated work piece 170 may lean against and/or in contact with the support baffle 110 of a next shelf 140. The work piece 170 is in contact with the buffer material 110B formed on the surface of the support baffle 110. The work piece 170 is clipped by the tip of the contacting surface 122 on the elevating element 120 of one shelf 140 and the buffer material 110B on the support baffle 110 of a next shelf 140.

In some embodiments, the work piece holder 100 with the elevating element 120 at the lock status is able to be flipped without striking the work pieces 170 since each work piece 170 is clipped by the elevating element 120 of one shelf 140 and the support baffle 110 of a next shelf 140. In some embodiments, the work piece 170 supported by one shelf 140 is oriented that the front surface FS faces the support baffle 110 of a next shelf 140. Therefore, in the unlock status shown in FIG. 3, the front surface FS is exposed without in contact with the work piece holder 100. In the lock status shown in FIG. 4, the front surface FS of the elevated work piece 170 is in contact with the buffer material 110B of the support baffle 110. Since the buffer material 110B is a softer portion of the support baffle 110, the buffer material 110B buffers the force applied to the front surface FS so as to avoid unwanted damage on the front surface FS. After flipping the structure of FIG. 4 upside down, the front surface FS faces down and the contamination would least likely fall on the front surface FS, which prevents the front surface FS from the fall defect caused by the falling contamination.

Figure 5:
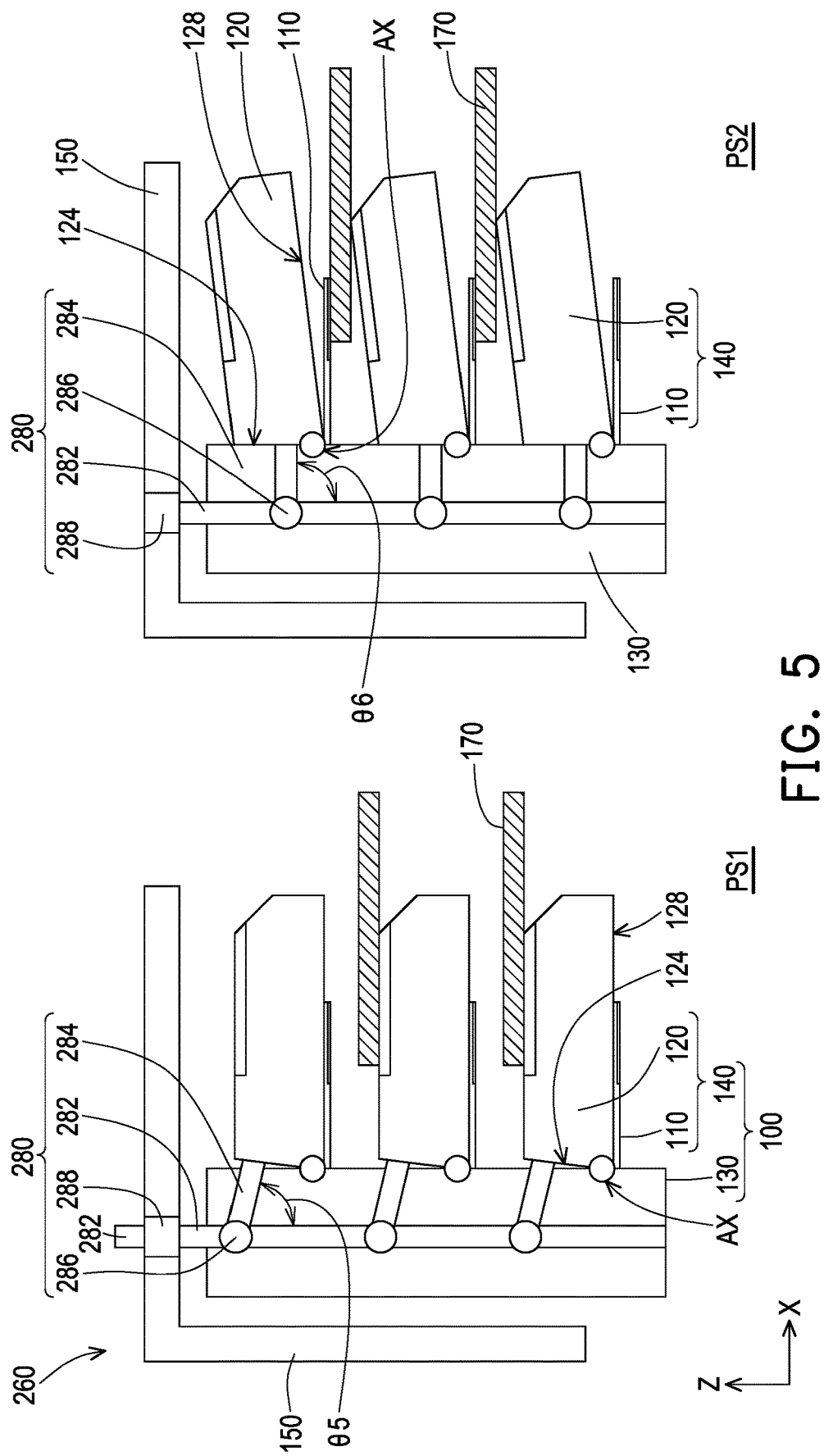
FIG. 5 schematically illustrates a portion of a work piece container in accordance with some embodiments.

FIG. 5 schematically illustrates a portion of a work piece container in accordance with some embodiments. A work piece container 260 presented in FIG. 5 includes a housing 150, a work piece holder 100 and a lock mechanism 280. The work piece holder 100 is accommodated inside the housing 150 as described in the previous embodiments. Specifically, the work piece holder 100 includes the support wall 130 and the shelves 140 disposed on the support wall 130 and each of the shelves 140 includes the support baffle 110 and the elevating element 120. The details of the work piece holder 100 may refer the descriptions of FIGS. 1 to 4 without repeated herein. The lock mechanism 280 is attached to the work piece holder 100 to adjust the status of the elevating element 120. The lock mechanism 280 presented in FIG. 5 provides a possible example that facilitate the movement of the elevating element 120, but the disclosure is not limited thereto.

The lock mechanism 280 may include a shaft 282, branches 284, joints 286 and a seal member 288. The shaft 282 extends along Z-axis. The branches 284 are connected between the elevating elements 120 and the shaft 282. The branches 284 are attached to the shaft 282 through the joints 286, respectively, such that the branches 284 are rotatable about the joints 286. The seal member 288 is disposed on the housing 150 and the shaft 282 extends through the seal member 288. The seal member 288 allows a portion of the shaft 282 to be protruded from the housing 150 and ensures the seal of the inner space of the housing 150 without a gas exchange between the inner space of the housing 150 and the external.

FIG. 5 shows the elevating element 120 at the unlock status PS1 and the lock status PS2. At the unlock status PS1, the shaft 282 is protruded from the housing 150, the leaning surface 128 of each elevating element 120 leans against the support baffle 110, and the stop surface 124 of each elevating element 120 is spaced from the support wall 130. In addition, the branches 284 of the lock mechanism 280 are included with the shaft 282 by a first angle θ5. As shown in FIG. 5, at the unlock status PS1, the work pieces 170 are supported by and in contact with the elevating elements 120 and spaced from the support baffles 110.

The protruded portion of the shaft 282 is pushed in an extending direction of the shaft 282 (e.g. Z-axis) to bring the elevating element 120 to the lock status PS2. The shaft 282 brings the joints 286 moving downwardly and the branches 284 are tilted through the joints 286 under the push. Accordingly, the branches 284 are respectively included with the shaft 282 by a second angle θ6. The branches 284 brings the elevating element 120 to rotate about the pivot axis AX until the stop surfaces 124 of the elevating elements 120 lean against the support wall 130. Now, the leaning surfaces 128 of the elevating elements 120 leave the support baffles 110. At the lock status PS2, each of the work pieces 170 is elevated to contact the support baffle 110 of a next shelf 140.

In some embodiments, the shaft 282 of the lock mechanism 280 may include a push-push mechanical structure, but not limited thereto. The structure that the branches 284 are included with the shaft 282 by the second angle θ6 is not released until the shaft 282 is pushed again. In other words, the elevating elements 120 at the lock status PS1 may restore to the unlock status PS1 through a second push of the shaft 282. In addition, each of the work pieces 170 may be clipped between the elevating element 120 of one shelf 140 and the support baffle 110 of a next shelf 140 until the second push of the shaft 282. In some embodiments, the branches 284 and the joints 286 may be implemented by a reel mechanical structure so that the movement of the elevating element 120 is controlled by the extending and winding of the branches 284.

Figure 6:
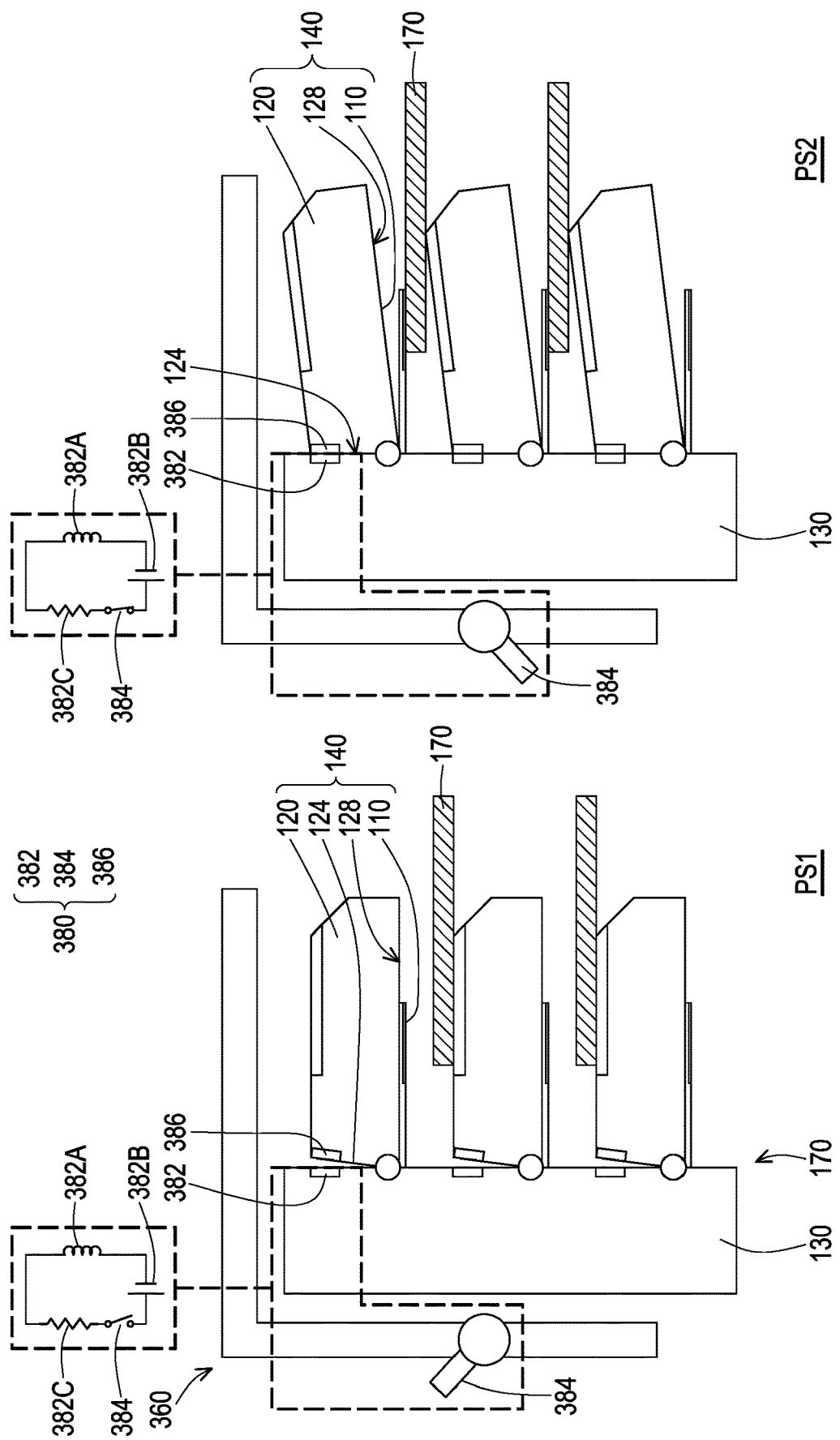
FIG. 6 schematically illustrates a portion of a work piece container in accordance with some embodiments.

FIG. 6 schematically illustrates a portion of a work piece container in accordance with some embodiments. A work piece container 360 presented in FIG. 6 includes a housing 150, a work piece holder 100 and a lock mechanism 380. The main difference between the embodiment of FIG. 6 and the embodiment of FIG. 5 is the implement of the lock mechanism 380 and thus the descriptions on other components in the two embodiments may refer each other. The lock mechanism 380 includes an electromagnet 382, a switch 384 and a magnetic member 386. The electromagnet 382 is attached to the support wall 130 of the work piece holder 100. The switch 384 is arranged on the housing 384 to control the on-off of the electromagnet 382. The magnetic member 386 is disposed on the elevating element 120. The electromagnet 382 and the magnetic member 386 are arranged adjacent to the stop surface 124 of the elevating element 120. The electromagnet 382 may include a coil 382A, a direct current power 282B and a resistor 382C connected in a loop. The switch 384 is connected on the loop to switch the electromagnet 382 on or off.

At the unlock status PS1, the electromagnet 382 is off so that no magnetic force is generated and the elevating element 120 is positioned that the leaning surface 128 leans against the support baffle 110 and the stop surface 124 is included with the support wall 130 by an angle. At the lock status PS2, the switch 384 switches the electromagnet 382 on. The magnetic force generated by the electromagnet 382 attracts the magnetic member 386 so that the stop surface 124 of the elevating element 120 moves toward the support wall 130 until the stop surface 124 in contact with the support wall 130. At the lock status PS2, the leaning surface 128 of the elevating element 120 is rotated to leave from the support baffle 110 and the work piece 170 is elevated to be clipped between the elevating element 120 of one shelf 140 and the support baffle 110 of a next shelf 140.

Figures 7C, 7D:
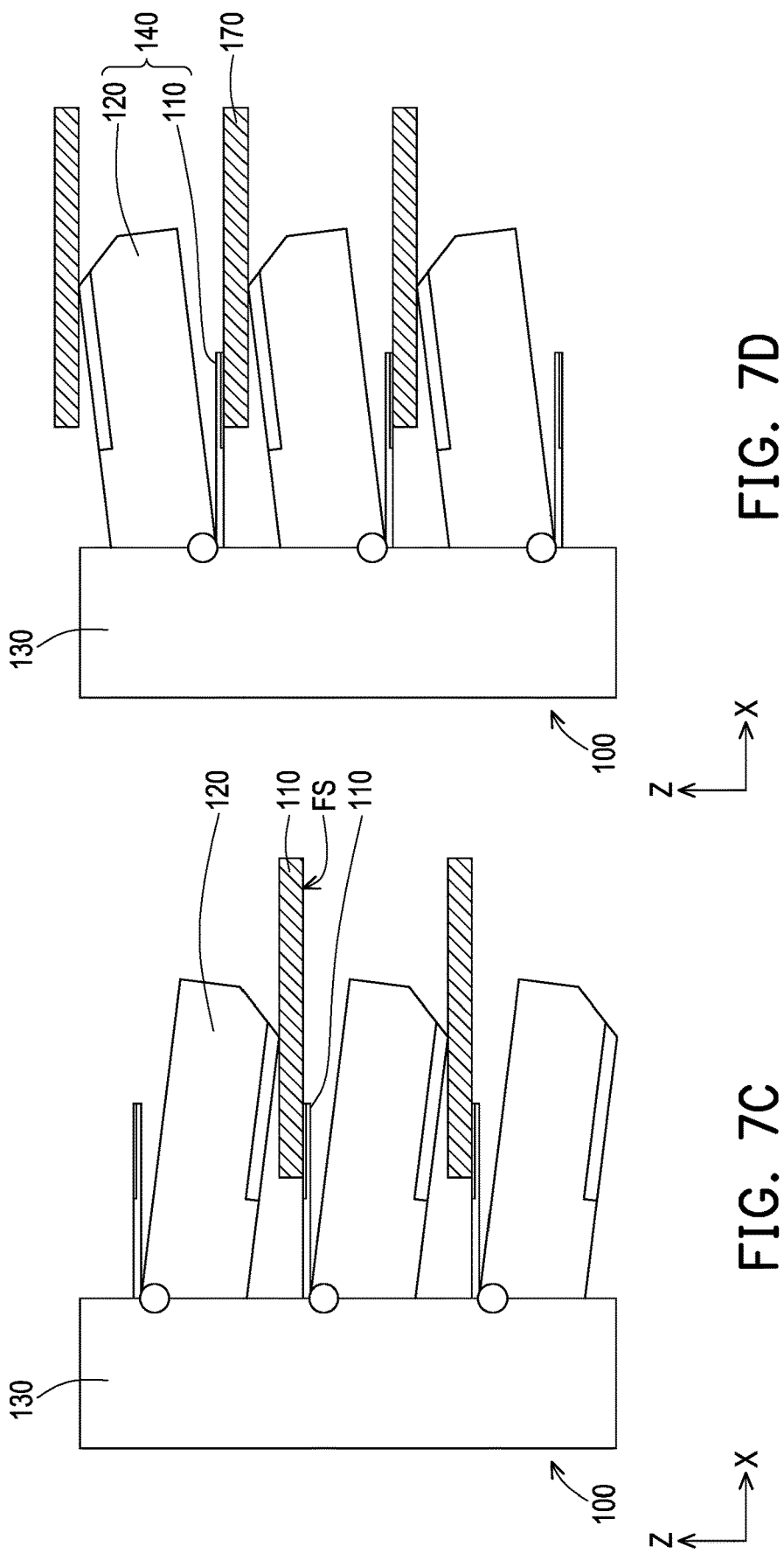

FIGS. 7A to 7E schematically illustrate a method of transferring a work piece in accordance with some embodiments. The step of FIG. 7A includes providing a work piece holder 100. The work piece holder 100 includes a support baffle 110 extends along an arc path and an elevating element 120 disposed along the support baffle 110. For clearly depicting the work piece holder 100, FIGS. 7A to 7E only present a portion of the work piece holder 100 and the other features of the work piece holder 100 may refer any of the previous embodiments. As stated in the previous embodiments, the support baffle 110 is fixed on a support wall 130 and the elevating element 120 is pivoted so that the elevating element 120 is rotatable/movable between an unlock status and a lock status. FIG. 7A shows the elevating element 120 is at the unlock status.

In addition, the step of FIG. 7A further includes placing a work piece 170 on the work piece holder 100 with the elevating element 120 at the unlock status. The work piece 170 may be a circular thin piece. In some embodiments, the work piece 170 may be a semiconductor wafer which includes, for example, a semiconductor substrate and circuitry structures form on the semiconductor substrate. The work piece 170 has a front surface FS where the circuitry structures are and a back surface BS where the semiconductor substrate is. The work piece 170 is placed on the elevating element 120 in a manner that the front surface FS is oriented upward. Accordingly, the back surface BS of the work piece 170 is in contact with the elevating element 120 and the front surface FS of the work piece 170 is exposed without contacting the work piece holder 100. In some embodiments, the elevating element 120 has a buffer material 120B on the contacting surface 122 and the work piece 170 is in direct contact with the buffer material 120B.

The step of FIG. 7B is further performed and includes moving the elevating element 120 to the lock status. The elevating element 120 of the work piece holder 100 may move through a control/operation of a lock mechanism that is described in FIG. 5 or 6 or a similar mechanism. The lock mechanism may perform a lock operation that enables the elevating element 120 to rotate until the stop surface 124 leans against the support wall 130. The work piece 170 is elevated by the rotating elevating element 120. The work piece 170 is in contact with the corresponding support baffle 110 upon the stop surface 124 of the elevating element 120 touches the support wall 130 and thus the work piece 170 is clipped between the elevating element 120 at the lock status and the support baffle 110. The support baffle 110 may include a buffer material 110B and the elevated work piece 170 is in contact with the buffer material 110B. In some embodiments, the front surface FS of the elevated work piece 170 is in contact with the buffer material 110B on the support baffle 110. In some embodiments, the extending length of the support baffle 110 outwardly from the support wall 130 is less than the elevating element 120. The support baffle 110 is in contact with a limited peripheral region of the front surface FS of the work piece 170 to reduce the contact area that the support baffle 110 contacts the front surface FS of the work piece 170.

In some embodiments, the work piece 170 has a peripheral region P170. The peripheral region P170 may extend inwardly from the edge of the work piece 170 by a distance of greater than 3 mm, for example, about 5 mm. In some embodiments, the peripheral region P170 may be a dummy region of a semiconductor wafer that is not remained in the final product such as a semiconductor die/chip, but the disclosure is not limited thereto. The elevating element 120 and the support baffle 110 are in contact with the work piece 170 within the peripheral region P170. In other words, the contact points of the elevating element 120 and the support baffle 110 contacting the work piece 170 are located inside the peripheral region P170, which prevents the components formed in the work piece 170 from damage due to contact.

Thereafter, the step of FIG. 7C is perform to flip the work piece holder 100 holding the work piece 170 with the elevating element 120 at the lock status. In FIG. 7C, the work piece holder 100 is flipped to be oriented that the elevating element 120 is located below the support baffle 110 in Z-axis. The work piece 170 is clipped between the elevating element 120 and the support baffle 110 so that the strike on the work piece 170 is restricted during the flipping, which allows flipping the work piece holder 100 without damaging the work piece 170. The elevating element 120 is at the lock status and the work piece 170 clipped between the elevating element 120 and the support baffle 110 is oriented that the front surface FS faces down in Z-axis. Therefore, contamination is prevented from falling on the front surface FS of the work piece 170, which helps to reduce the so-called fall defect.

The step of FIG. 7C may further include transferring the flipped work piece holder 100 holding the work piece 170 with the elevating element 120 at the lock status. Similar to those described in the previous embodiments, the work piece holder 100 is accommodated inside the housing 150 (refer to FIG. 1) and the transferring of the work piece holder 100 includes transferring the housing 150 by a transferring tool/vehicle. In some embodiments, the housing 150 accommodating the work piece holder 100 is vacuumed so that the work piece 170 hold by the work piece holder 100 is transferred inside a vacuumed chamber to avoid external contaminations. In some embodiments, the work piece 170 hold by the work piece holder 100 is transferred under the orientation that the front surface FS faces down. The in-situ contamination inside the housing 150 would least likely fall on the front surface FS of the work piece 170 during the transferring so that the work piece 170 is prevented from unwanted falling contamination.

After transferring the flipped work piece holder 100 onto the predetermined site, the flipped work piece holder 100 with the elevating element 120 at the lock status is further flipped upside down as shown in FIG. 7D. Now, the orientation of the work piece holder 100 is substantially the same as that presented in FIG. 7B. Specifically, the support baffle 110 of each shelf 140 is located below the elevating element 120 and the work piece 170 clipped between the elevating element 120 of one shelf 140 and the support baffle 110 of a next shelf 140 is oriented that the front surface FS faces up.

Figure 7E:
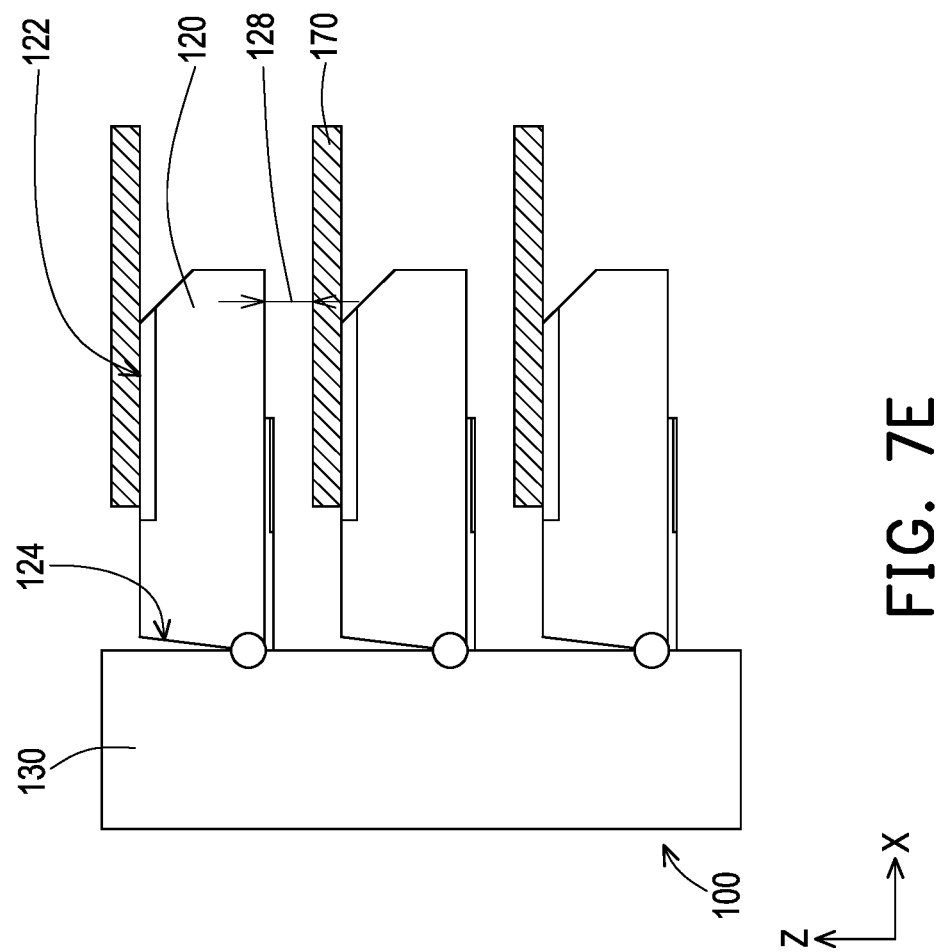

After the work piece holder 100 being transferred onto the predetermined site, the elevating element 120 is moved from the lock status to the unlock status as shown in FIG. 7E. The unlock status of the work piece holder 100 is substantially the same as that presented in FIG. 7A. In some embodiments, the elevating element 120 is controlled by the lock mechanism described in FIG. 7B and the lock mechanism performs an unlock operation so that the elevating element 120 is released from the lock status and moves to the unlock status. As such, the leaning surface 128 leans against the support baffle 110 and the stop surface 124 is separated from the support wall 130. Under the unlock operation, the elevating element 120 descends the work piece 170 to separate the work piece 170 from the support baffle 110. The work piece 170 leans on the contacting surface 122 of the elevating element 120 and is able to be picked from the work piece holder 100 to subject the required processing/treatment.

Figure 8:
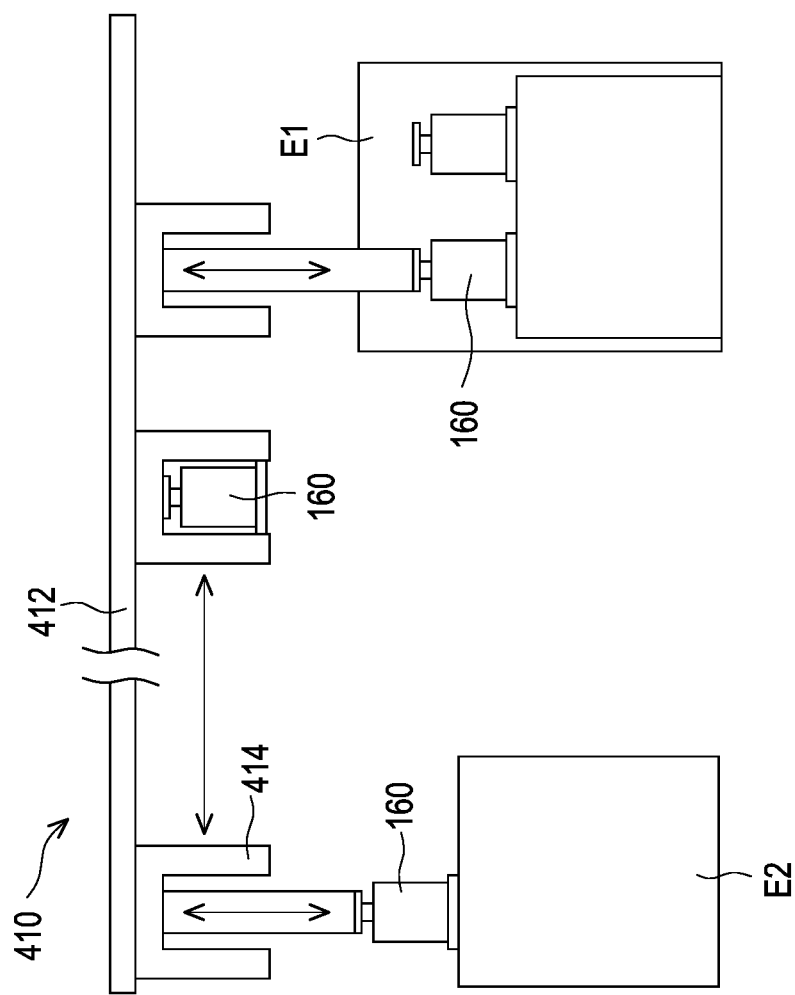
FIG. 8 schematically illustrates a semiconductor fabrication facility in accordance with some embodiments.

In some embodiments, the method of FIGS. 7A to 7E is applicable in a semiconductor fabrication facility. FIG. 8 schematically illustrates a semiconductor fabrication facility in accordance with some embodiments. The semiconductor fabrication facility 400 shown in FIG. 8 may be a schematic perspective diagram of an automatic material handling system (AMHS) and includes at least one of overhead hoist transfer (OHT), overhead shuttle (OHS), rail guided vehicle (RGV), automated guided vehicle (AGV), personal guided vehicle (PGV), or combinations thereof. A plurality of work piece containers 160 may be controllably and fluently transported between various processing tools, stockers, and processing bays to facilitate manufacturing of semiconductor products. That is, the semiconductor fabrication facility 400 facilitates inter-bay connection and/or intra-bay connection.

As shown in FIG. 8, one or more overhead hoist transfer system 410 is at least arranged between a processing tool E1 and a staging equipment E2 (or a relay station), but the disclosure is not limited thereto. The overhead hoist transfer system 410 includes a rail 412 and one or more vehicles 414 that are movable on the rail 412. The rail 412 may include a monorail affixed to and suspended from the ceiling of the semiconductor fabrication facility 400. The vehicles 414 are configured and operable to pick up, raise/lower, hold, articulate, and release the work piece container 160. The vehicle 414 includes a motor-driven or pneumatic hoisting mechanism. In some embodiments, the work piece container 160 may include the work piece holder 100 described in any of the previous embodiments and the work piece holder 100 is configured to hold and support one or more thin-plate-like work pieces such as semiconductor wafers.

In some embodiments, the work piece container 160 with the work piece holder 100 accommodates multiple work pieces 170 as shown in FIG. 7A may be placed on the staging equipment E2. Prior to being picked by the vehicle 414, the work piece holder 100 inside the work piece container 160 is switched to the lock status as shown in FIG. 7B and the work piece container 160 is flipped upside down while the work piece holder 100 maintains at the lock status as shown in FIG. 7C. The vehicle 414 then picks the flipped work piece container 160 from the staging equipment E2 and transfers the flipped work piece container 160 along the rail 412 to a position over the processing tool E1. The vehicles 414 then lower/descend the flipped work piece container 160 to place the work piece container 160 on the processing tool E1, and the flipped work piece container 160 is further flipped on the processing tool E1 so that the orientation of the work piece 170 carried by the work piece container 160 presents the status shown in FIG. 7D. Prior to pick/withdraw the work piece 170 from the work piece container 160, the work piece holder 100 is switched to the unlock position as shown in FIG. 7E. Thereafter, the front door 154 of the housing 150 (refer to FIG. 1) of the work piece container 160 is opened to allow a machine arm to pick/withdraw the work piece 170 from the work piece holder 100 inside the work piece container 160. During transferring the work piece container 160 by the vehicles 414, the work pieces 170 remain the orientation of the front surface FS facing down so that contamination caused during the transferring would least likely falls on the front surface FS of the work piece 170, which reduces the so-called fall defect of the work piece 170 and facilitates to improve the fabrication yield.

In the embodiments of the disclosure, the work piece holder includes a movable elevating element and a fixed support baffle. The elevating element at an unlock status supports the work piece spaced from the next shelf. The elevating element at a lock status clips the work piece with the support baffle of the next shelf. The work piece holder allows to be flipped upside down under the lock status without striking the work piece. The work piece holder allows to transfer the work piece oriented that the front surface facing down to prevent from fall defects caused by falling contamination.

In accordance with some embodiments, a work piece holder includes a support baffle and an elevating element. The support baffle extends along an arc path. The elevating element is disposed along the support baffle and is pivoted to be movable between an unlock status and a lock status. The work piece holder further includes a support wall, wherein the support baffle is connected to the support wall and the elevating element is pivoted along a connection between the support baffle and the support wall. The elevating element has a contacting surface configured to contact a work piece and a leaning surface configured to lean against the support baffle, and the contacting surface is opposite to the leaning surface. The elevating element at the unlock status leans against the support baffle. The elevating element at the lock status is included with the support baffle by an angle. The elevating element is spaced from a terminal of the support baffle by a first radian along the arc path. The first radian is more than 10 degrees. The elevating element extends a second radian along the arc path and the second radian is from 10 degrees to 70 degrees. A sum of the first radian and the second radian may be smaller than 80 degrees. The elevating element may include a buffer material away from the support baffle. The support baffle may include a buffer material away from the elevating element.

In accordance with some embodiments, a work piece holder includes a support wall extending an arc path and shelves connected to an inner side of the support wall. The shelves are arranged in parallel. Each of the shelves includes a support baffle extending along the arc path; and a pair of elevating elements disposed on the support baffle and the pair of elevating elements being arranged symmetrically, wherein each of the elevating element is included with the support baffle by an included angle. The each of the elevating element may have a distal end away from the support wall, and a distance of the distal end to a next shelf is reduced with an increase of the included angle. The included angle may range from 0 degree to 30 degrees. The each of the elevating element has a stop surface facing the support wall and a leaning surface extending facing the support baffle, and the elevating element is pivoted at an intersection of the stop surface and the leaning surface. The work piece holder may further include a lock mechanism connected to the elevating element. The lock mechanism may include a push-push mechanical structure, or an electromagnet.

In accordance with some embodiments, a method of transferring a work piece includes the steps including providing a work piece holder, wherein the work piece holder may include: a support baffle extending along an arc path and an elevating element disposed along the support baffle and pivoted to be movable between an unlock status and a lock status; placing a work piece on the work piece holder with the elevating element at an unlock status; moving the elevating element to the lock status to elevate the work piece; flipping the work piece holder holding the work piece with the elevating element at the lock status; and transferring the flipped work piece holder holding the work piece with the elevating element at the lock status. The flipped work piece holding the work piece with the elevating element is further flipped at the lock status. The work piece is placed on the elevating element of the work piece holder with a front surface of the work piece facing opposite to the support baffle. The elevating element may move from the lock status to the unlock status.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A work piece holder, comprising:
a support baffle extending along an arc path; and
an elevating element disposed on the support baffle and pivoted to be movable between an unlock status and a lock status, wherein in a radius direction of the arc path, an extending length of the elevating element is greater than an extending length of the support baffle.

2. The work piece holder of claim 1, further comprising a support wall, wherein the support baffle is connected to the support wall and the elevating element is pivoted at a connection between the support baffle and the support wall.

3. The work piece holder of claim 1, wherein the elevating element has a contacting surface configured to contact a work piece and a leaning surface configured to lean against the support baffle, and the leaning surface is opposite to the contacting surface.

4. The work piece holder of claim 1, wherein the elevating element at the unlock status leans against the support baffle.

5. The work piece holder of claim 1, wherein the elevating element at the lock status is oblique with respect to the support baffle.

6. The work piece holder of claim 1, wherein the elevating element is spaced from a terminal of the support baffle by a first radian along the arc path.

7. The work piece holder of claim 6, wherein the first radian is more than 10 degrees.

8. The work piece holder of claim 7, wherein the elevating element extends in a range of a second radian along the arc path and the second radian is from 10 degrees to 70 degrees.

9. The work piece holder of claim 8, wherein a sum of the first radian and the second radian is smaller than 80 degrees.

10. The work piece holder of claim 1, wherein the elevating element comprises a buffer material away from the support baffle.

11. The work piece holder of claim 1, wherein the support baffle comprises a buffer material away from the elevating element.

12. A work piece holder, comprising:
a support wall extending along an arc path; and
shelves connected to an inner side of the support wall, arranged in parallel and each of the shelves comprising:
a support baffle extending along the arc path; and
a pair of elevating elements disposed on the support baffle and the pair of elevating elements being arranged symmetrically, wherein each of the elevating element is movable to have a changeable tilt angle with respect to the support baffle.

13. The work piece holder of claim 12, wherein the changeable tilt angle ranges from 0 degree to 30 degrees.

14. The work piece holder of claim 12, wherein the each of the elevating elements has a stop surface facing the support wall and a leaning surface facing the support baffle, and the elevating element is pivoted at an intersection of the stop surface and the leaning surface.

15. The work piece holder of claim 14, wherein further comprising a lock mechanism connected to the elevating element.

16. The work piece holder of claim 15, wherein the lock mechanism is configured to lock the changeable tilt angle of the elevating element.

17. A method of transferring a work piece, comprising:
providing a work piece holder, wherein the work piece holder comprises: a support baffle extending along an arc path; and an elevating element disposed on the support baffle and pivoted to be movable between an unlock status and a lock status, wherein in a radius direction of the arc path, an extending length of the elevating element is greater than an extending length of the support baffle;
placing a work piece on the work piece holder with the elevating element at the unlock status;
moving the elevating element to the lock status to elevate the work piece;
flipping the work piece holder holding the work piece with the elevating element at the lock status; and
transferring the flipped work piece holder holding the work piece with the elevating element at the lock status.

18. The method of claim 17, further flipping the flipped work piece holding the work piece with the elevating element at the lock status.

19. The method of claim 17, wherein the work piece is placed on the elevating element of the work piece holder with a front surface of the work piece facing away from the elevating element.

20. The method of claim 17, further comprising moving the elevating element from the lock status to the unlock status.

* * * * *